March 10, 1970 I. KAUFMAN 3,500,249

FREQUENCY MODULATED SIGNAL GENERATOR

Filed Aug. 14, 1967 2 Sheets-Sheet 1

Irving Kaufman,
INVENTOR.
BY.
Edward Dugas
AGENT.

FREQUENCY MODULATED SIGNAL GENERATOR

Filed Aug. 14, 1967 2 Sheets-Sheet 2

Irving Kaufman,
INVENTOR.
BY.
Edward Dugas
AGENT.

United States Patent Office 3,500,249
Patented Mar. 10, 1970

3,500,249

FREQUENCY MODULATED SIGNAL GENERATOR

Irving Kaufman, Tempe, Ariz., assignor to TRW Inc., Redondo Beach, Calif., a corporation of Ohio Filed Aug. 14, 1967, Ser. No. 660,277
Int. Cl. H03c 3/12
U.S. Cl. 332—29 4 Claims

ABSTRACT OF THE DISCLOSURE

A variable resonant tank circuit is connected to a modulating signal source so that the resonant frequency of the tank circuit varies as a function of the input modulating signal. A broadband filter network is connected by means of an energy storage element, such as a varactor, to the variable resonant tank circuit. The energy storage element is pumped at a pump frequency which remains substantially constant. The signal from the filter network is then equal to the difference between the pump frequency and the modulated frequency of the tank circuit.

BACKGROUND OF THE INVENTION

This invention pertains to the field of parametric type devices and, more particularly, to a frequency modulated signal generator utilizing a parametric type oscillator. In frequency modulated signal generators, the frequency of an oscillator is made to vary in accordance with the amplitude of a modulating signal. One of the most common methods of achieving frequency modulation is the use of a reactance tube which is connected in circuit to an oscillator circuit such as a Hartley oscillator. The resonant circuit of the oscillator is caused to change because of the variance in the reactance of the tube, which in turn changes the frequency of the oscillator in proportion to the change in reactance. It is also possible to generate a frequency modulated signal by utilizing an astable multivibrator and varying the frequency of the multivibrator by various means, such as changing the bias level on the multivibrator tubes or transistors. With the advent of variable reactance type devices such as varactors and their use in parametric type oscillators, it has become increasingly desirable to utilize these devices for generating frequency modulated signals in the standard electrical frequency ranges.

SUMMARY OF THE INVENTION

In a preferred embodiment of the invention, a broadband filter network acts as a tuned circuit, tuned over its output range to the band width of the frequency modulated signal. A second tuned circuit, designated an idling circuit, is coupled to a modulating signal source such that the modulating signal varies the resonant frequency to which the second circuit is tuned. A variable reactance coupling circuit connected in common between the filter network and the second tuned circuit varies its coupling reactance by means of a pump oscillator which is connected to the variable reactance coupling element. The frequency of the pump oscillator remains substantially constant and is equal to the sum of the frequencies of the idling tuned circuits and the frequency of the broadband filter network. When the frequency of the second tuned circuit is varied, the sum of the filter frequency and the tuned circuit frequency must still remain equal to the pump frequency; therefore, the signal out of the filter network is modulated at the frequency of the modulation source.

Accordingly, it is an object of the present invention to provide a novel frequency modulated signal generator utilizing a parametric oscillator.

It is a further object of the present invention to provide an apparatus for modulating a parametric oscillator circuit.

The aforementioned and other objects of the present invention will become more apparent when taken in conjunction with the following description and drawings, throughout which like characters indicate like parts, and which drawings form a part of this application.

DESCRIPTION OF THE PREFERRED EMBODIMENT

Figure 1:
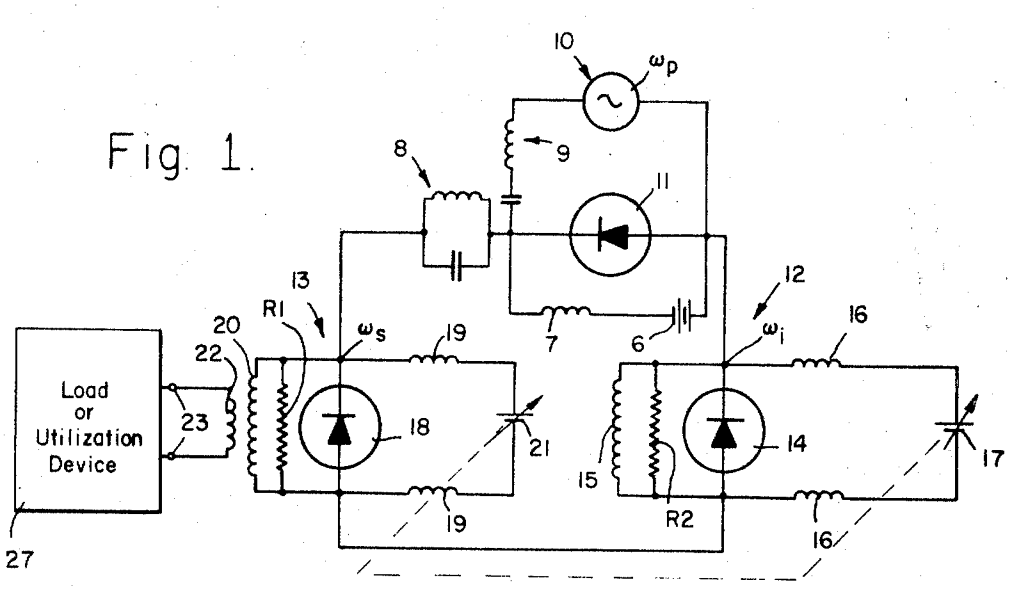
FIGURE 1 is a schematic diagram illustrating an embodiment of the present invention.

Referring now to FIGURE 1, a pump oscillator 10 generates a signal having a frequency $\omega_p$. The variable reactance element 11 may be a varactor. A series resonant circuit 9, which passes only currents of frequency $\omega_p$, is inserted in circuit between the pump 10 and the variable reactance coupling element 11. An RF-choke 7 is serially connected to a bias supply 6 and the series connected combination is connected in parallel across the element 11. An idling circuit 12 is connected to the signal circuit 13 by means of the variable reactance element 11, and a shunt resonant circuit 8, which is resonant to block currents of frequency $\omega_p$. The idling circuit 12 is a resonant circuit comprised of an inductor 15, a resistance $R_2$ in parallel with the inductor 15, the resistance $R_2$ being equivalent to the distributed resistance of the idling circuit 12, and a variable reactance element 14 connected in parallel with the inductor 15 along with a variable biasing source 17 connected across the variable reactance elements 14 by means of RF-chokes 16. The resonant frequency of the idling circuit 12 is designated $\omega_i$. The frequency $\omega_i$ may be scanned over a predetermined range by varying the value of the biasing source 17. The tuned signal circuit 13 is a resonant tank circuit comprised of inductor 20, a resistance $R_1$ in parallel with the inductor 20, the resistance $R_1$ being equivalent to the distributed resistance of the tuned signal circuit 13, and a variable reactance element 18, along with a biasing source 21 connected by means of RF-chokes 19 across the variable reactance element 18. The tuned signal circuit is resonant at a frequency of $\omega_s$ which may be varied by changing the value of the applied potential from the biasing source 21. The frequency from the pump source $\omega_p$ remains substantially constant. The circuit is adjusted so that $\omega_i+\omega_s=\omega_p$. In this particular mode of operation the coil 22, which is coupled to coil 20, receives the signal $\omega$ and makes this signal available across the output terminals 23 to a load or utilization device 27. The bias sources 17 and 21 are ganged together such that the sum of the resonant frequencies $\omega_i$ of idling circuit 12 and $\omega_s$ of the tuned signal circuit 13 are always equal to $\omega_p$, the frequency of the pump 10. With this relationship of resonant frequencies, it is possible to vary the values of the biasing sources at the desired frequency of modulation and, in turn, to have the frequency $\omega_s$ frequency-modulated at the frequency that the biasing sources are varied.

Figure 2:
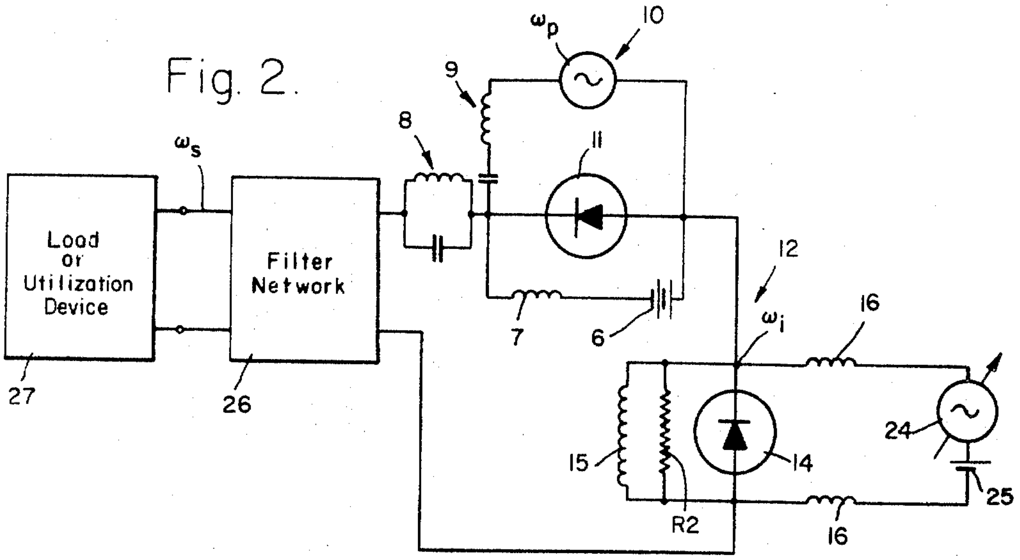
FIGURE 2 is a schematic diagram illustrating a second embodiment of the present invention.

Referring now to FIGURE 2, the pump frequency source 10 is connected across the variable reactance element 11 by means of a series tuned circuit 9, tuned to pass a signal of frequency $\omega_p$. A tuned idler circuit 12, tuned to frequency $\omega_i$, is comprised of an inductor 15 connected in parallel with a variable reactance element 14 and a resistance $R_2$ which is the equivalent distributed resistance of the idling circuit 12. A modulating frequency source 24 is serially connected to a bias source 25 and the series connected elements are connected across the variable reactance element 14 by means of RF-chokes 16. A broadband filter network 26 replaces the tuned signal circuit 13 of FIGURE 1. The variable reactance element 11 connects the idling circuit 12 to the filter network 26 via the tuned parallel tank circuit 8, which is resonant to block currents of frequency $\omega_p$. The output signal from the filter network has a frequency $\omega_s$ and is fed to a load or utilization device 27. In operation, the frequency $\omega_p$ from the pump source 10 is maintained substantially constant and equal to the sum of the idler frequency $\omega_i$ and the signal frequency $\omega_s$. The filter network 26 is broadband and the idling circuit 12 is a single tank circuit. By pumping sufficiently hard at $\omega_p$, the circuit will oscillate at $\omega_i$ and $\omega_s$ will be equal to $\omega_p - \omega_i$. The output to the utilization device 27 will be a signal of frequency $\omega_s$. By varying the voltage signal generated by modulation signal source 24, the idler frequency $\omega_i$ will be varied in proportion to the magnitude of the modulation signal source. The relationship $\omega_s = \omega_p - \omega_i$ remains constant in the circuit; therefore, if $\omega_i$ is modulated, it in turn will frequency modulate $\omega_s$ a proportionate amount.

Figure 3:
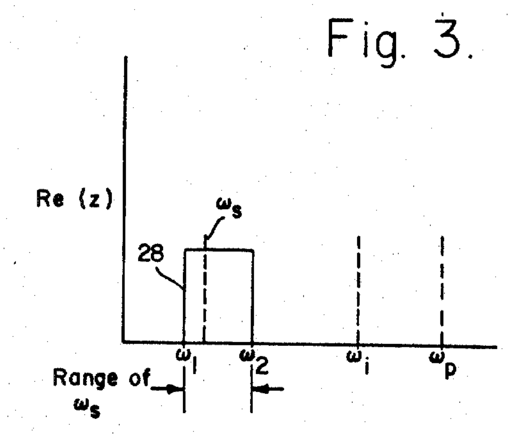
FIGURE 3 is a frequency response graph illustrating the operation of the embodiment of FIGURE 4.

Referring to FIGURE 3, the frequency response of the broadband filter network 26 is shown as the rectangular box 28. The real portion of the input impedance R*e* (Z) to the filter network is high over the ranges from $\omega_1$ to $\omega_2$. With the pump frequency $\omega_p$ remaining at a constant value, variations in the idler frequency $\omega_i$, caused by varying the resonance of the idler tank circuit 12, will cause the signal frequency $\omega_s$ to frequency modulate between $\omega_1$ and $\omega_2$.

Figure 4:
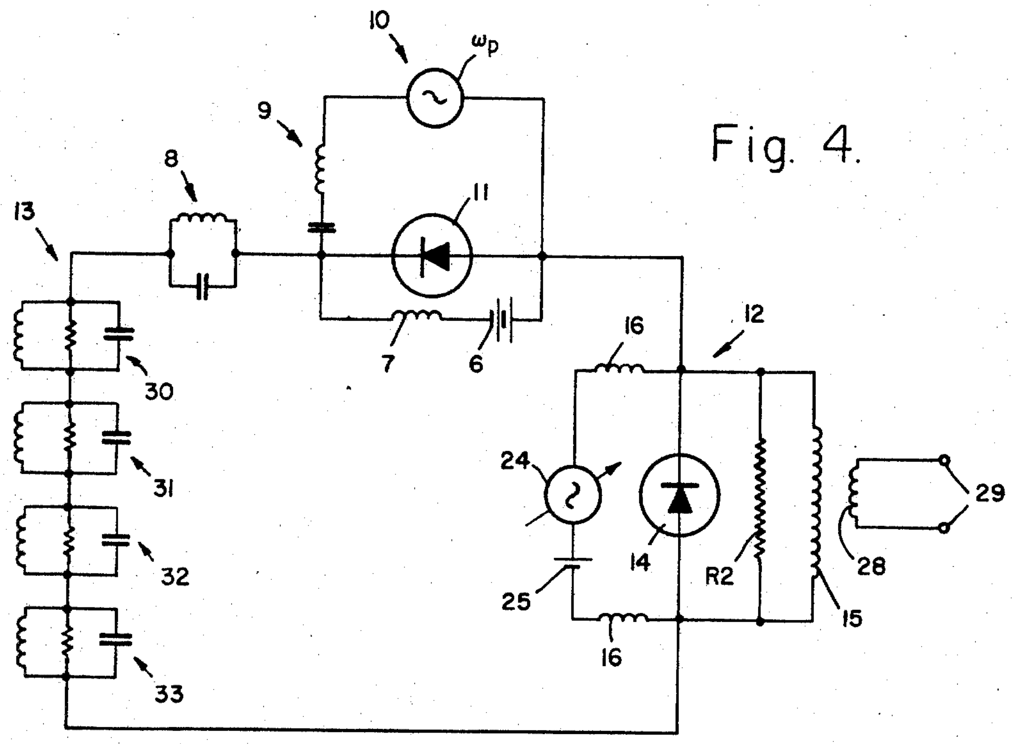
FIGURE 4 is a schematic diagram illustrating a third embodiment of the present invention.

Referring now to FIGURE 4, the basic circuit of FIGURE 2 is repeated with the filter network 26 replaced by filters 30, 31, 32 and 33. Filters 30, 31, 32 and 33 are stagger tuned to form a high impedance network over a broadband of frequencies. Other networks that may be used to perform the same function will be obvious to those persons skilled in the art.

The output of this circuit is taken from the inductor 15 by means of a coupling coil 28. The output signal is then passed to a utilization device or load (not shown) via terminal 29.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as fall within the true scope of the invention.

What is claimed is:

1. A parametric frequency-modulated signal generator comprising:

(a) first variable resonant circuit means capable of resonating and idle frequency;
(b) second variable resonant circuit means capable of resonating at a pump frequency;
(c) third resonant circuit means capable of resonating at a signal frequency, said resonant circuit means being coupled to each other to form a closed loop;
(d) variable reactance means coupled individually to each of said first and second resonant circuit means for varying the resonant frequency thereof;

(e) pump means coupled to the variable reactance means associated with said second circuit means for pumping it at a frequency corresponding to the sum of the idler and signal frequencies;
(f) a modulating signal source coupled to said first resonant circuit means for varying the resonant frequency thereof as a function of the modulating signal; and
(g) utilization means coupled to one of said resonant circuit means for deriving an output signal at the frequency of said signal and frequency modulated in accordance with said modulating signal.

2. A signal generator as defined in claim 1 wherein said third resonant circuit means consists of a resonant tank circuit having a broad pass band for passing said frequency-modulated output signal.

3. A signal generator as defined in claim 1 wherein said third resonant circuit means includes a variable reactance means coupled thereto, and wherein said modulating signal source is coupled to the variable reactance means associated with said first and said third resonant circuit means for modulating the resonant frequency thereof in opposite directions so that the sum of said idle frequency and of said signal frequency equals said pump frequency.

4. A parametric frequency-modulated signal generator comprising:

(a) first variable resonant circuit means capable of resonating at an idle frequency and including a first variable resonant element;
(b) second variable resonant circuit means capable of resonating at a signal frequency and including a second variable resonant element;
(c) third variable resonant circuit means capable of resonating a pump frequency and including a third variable reactance element, said resonant circuit means being coupled to each other to form a closed loop;
(d) a pump generator coupled to said third variable reactance element for pumping it at a frequency corresponding to the sum of the idler and signal frequencies;
(e) a modulating signal source coupled to said first and second resonant circuit means for varying the resonant frequencies thereof in opposite directions as a function of the modulating signal so that the sum of the idle and signal frequencies remains equal to the pump frequency; and
(f) output circuit means coupled to said second resonant circuit means for deriving an output signal at the signal frequency and having its frequency modulated by said modulating signal.

References Cited

UNITED STATES PATENTS 3,346,740 10/1967 Brobst et al. ________ 307—88.3

FOREIGN PATENTS 1,017,095 1/1966 Great Britain.

ROY LAKE, Primary Examiner

LAWRENCE J. DAHL, Assistant Examiner

U.S. Cl. X.R.

307—88.3; 330—4.5